United States Patent
Moore et al.

(10) Patent No.: US 11,824,092 B2
(45) Date of Patent: Nov. 21, 2023

(54) INSULATED TRENCH GATES WITH DOPANTS IMPLANTED THROUGH GATE OXIDE

(71) Applicant: Pakal Technologies, Inc., San Francisco, CA (US)

(72) Inventors: Paul M. Moore, Fremont, CA (US); Vladimir Rodov, Seattle, WA (US); Richard A. Blanchard, Los Altos, CA (US)

(73) Assignee: PAKAL TECHNOLOGIES, INC, San Francisco, CA (US)

( * ) Notice: Subject to any disclaimer, the term of this patent is extended or adjusted under 35 U.S.C. 154(b) by 180 days.

(21) Appl. No.: 17/388,442

(22) Filed: Jul. 29, 2021

(65) Prior Publication Data
US 2022/0045168 A1 Feb. 10, 2022

Related U.S. Application Data

(60) Provisional application No. 63/060,954, filed on Aug. 4, 2020.

(51) Int. Cl.
*H01L 29/08* (2006.01)
*H01L 29/423* (2006.01)
(Continued)

(52) U.S. Cl.
CPC ........ *H01L 29/086* (2013.01); *H01L 27/0921* (2013.01); *H01L 29/401* (2013.01);
(Continued)

(58) Field of Classification Search
CPC ............. H01L 29/7836; H01L 29/7827; H01L 29/086; H01L 29/4236; H01L 29/42364;
(Continued)

(56) References Cited

U.S. PATENT DOCUMENTS

| 2006/0079068 A1* | 4/2006 | Sheu | ..................... H10B 12/038 257/E21.628 |
| 2010/0065904 A1* | 3/2010 | Pan | ..................... H01L 29/1095 257/330 |

(Continued)

FOREIGN PATENT DOCUMENTS

WO WO 2011/108191 A2 9/2011

*Primary Examiner* — Joseph C. Nicely
(74) *Attorney, Agent, or Firm* — Patent Law Group; Brian Ogonowsky

(57) ABSTRACT

In an insulated trench gate device, polysilicon in the trench is etched below the top surface of the trench, leaving a thin gate oxide layer exposed near the top of the trench. An angled implant is conducted that implants dopants through the exposed gate oxide and into the side of the trench. If the implanted dopants are n-type, this technique may be used to extend an n+ source region to be below the top of the polysilicon in the trench. If the implanted dopants are p–type, the dopants may be used to form a p-MOS device that turns on when the polysilicon is biased with a negative voltage. P-MOS and n-MOS devices can be formed in a single cell using this technique, where turning on the n-MOS device turns on a vertical power switch, and turning on the p-MOS device turns off the power switch.

12 Claims, 7 Drawing Sheets

(51) Int. Cl.
   *H01L 27/092* (2006.01)
   *H01L 29/66* (2006.01)
   *H01L 29/78* (2006.01)
   *H01L 29/40* (2006.01)
   *H01L 29/745* (2006.01)

(52) U.S. Cl.
   CPC .... *H01L 29/4236* (2013.01); *H01L 29/42364* (2013.01); *H01L 29/66734* (2013.01); *H01L 29/7813* (2013.01); *H01L 29/7455* (2013.01)

(58) Field of Classification Search
   CPC ........... H01L 29/66734; H01L 29/7813; H01L 21/823487; H01L 21/26586; H01L 27/0921
   See application file for complete search history.

(56) References Cited

U.S. PATENT DOCUMENTS

| | | | |
|---|---|---|---|
| 2013/0001681 A1* | 1/2013 | Sin | H01L 29/4236 438/270 |
| 2017/0373185 A1* | 12/2017 | Yilmaz | H01L 27/088 |
| 2019/0305079 A1* | 10/2019 | Osuga | H01L 29/086 |

* cited by examiner

INSULATED TRENCH GATES WITH DOPANTS IMPLANTED THROUGH GATE OXIDE

CROSS-REFERENCE TO RELATED APPLICATIONS

This application is based on provisional application Ser. No. 63/060,954, filed Aug. 4, 2020, by Paul M. Moore et al., assigned to the present assignee and incorporated herein by reference.

FIELD OF THE INVENTION

This invention relates to insulated gate power devices having gates (doped polysilicon) formed in etched trenches and, in particular, to a technique for implanting dopants into the silicon outside the trench through the thin gate oxide. The doping may be used to form source regions adjacent to the polysilicon partially filling the trench or for other purposes.

BACKGROUND

The invention deals with improvements in insulated trench gates. To put a trench gate in the context of an insulated gate power device, a particular power device will be described, followed by details of techniques to form doped regions through the gate oxide of the trench gates.

Prior art FIG. 1 is a cross-section of a small portion of an insulated trench gate power device 10 reproduced from the assignee's U.S. Pat. No. 9,391,184, incorporated herein by reference. The device 10 may be used as an on/off power switch. The portion is near an edge of the device and shows a plurality of cells having vertical gates 12 formed in insulated trenches. A 2-dimensional array of the cells may be formed in a common p–well 14, and the cells are connected in parallel. The edge of the device suffers from field crowding, and the edge cell is modified to increase ruggedness of the device. The edge cell has an opening 16 in the n+ source region 18 where the cathode electrode 20 shorts the n+ source region 18 to the p–well 14. Such shorting increases the tolerance to transients to prevent unwanted turn on and prevents the formation of hot spots. The configuration of the edge cell may also be used in other cells of the device for a more uniform current flow across the device. The opening 16 is shown as being smaller than the n+ source region spacing in the cell, but the opening 16 can be larger so that the cathode electrode 20 creates a short between the n+ source region in the cell and the p–well 14.

Trenches 15 are etched in the surface of the silicon wafer, and the sidewalls of the trench 15 are oxidized to form an oxide layer 22. Doped polysilicon is deposited in the trenches 15 using CVD to form vertical gates 12. The vertical gates 12 are insulated from the p–well 14 by the oxide layer 22. The narrow gates 12 (doped polysilicon) are connected together outside the plane of the drawing and are coupled to a gate voltage via the gate electrode 25 contacting the polysilicon portion 28. A patterned dielectric layer 26 insulates the metal from the various regions. The guard rings 29 at the edge of the cell reduce field crowding for increasing the breakdown voltage.

An npnp semiconductor layered structure is formed. There is a bipolar pnp transistor formed by a p+ substrate 30, an n– epitaxial (epi) layer 32, and the p– well 14. There is also a bipolar transistor formed by the n–epi layer 32, the p–well 14, and the n+ source region 18. An n-type buffer layer 35, with a dopant concentration higher than that of the n– epi layer 32, reduces the injection of holes into the n– epi layer 32 from the p+ substrate 30 when the device is conducting. It also reduces the electric field of the anode pn junction when the power device 10 is reverse biased. A bottom anode electrode 36 contacts the substrate 30, and a cathode electrode 20 contacts the n+ source region 18. The p–well 14 surrounds the gate structure, and the n– epi layer 32 extends to the surface around the p–well 14.

When the anode electrode 36 is forward biased with respect to the cathode electrode 20, but without a sufficiently positive gate bias, there is no current flow, since the product of the betas (gains) of the pnp and npn transistors is less than one (i.e., there is no regeneration activity).

When the gate is forward biased, electrons from the n+ source region 18 become the majority carriers along the gate sidewalls and below the bottom of the trenches in an inversion layer, causing the effective width of the npn base (the portion of the p–well 14 vertically between the n-layers) to be reduced. As a result, the beta of the npn transistor increases to cause the product of the betas to exceed one. This results in "breakover," when holes are injected into the lightly doped n– epi layer 32 and electrons are injected into the p–well 14 to fully turn on the device. Accordingly, the gate bias initiates the turn-on, and the full turn-on (due to regenerative action) occurs when there is current flow through the npn transistor as well as current flow through the pnp transistor.

When the gate bias is removed, such as the gate electrode 25 being shorted to the cathode electrode 20, the device 10 turns off.

The device 10 is similar to many other types of high current/high voltage insulated gate power devices in that it is cellular and the trenches are ideally completely filled with doped polysilicon with the source regions adjacent to the top portion of the polysilicon in the trenches. The sources are formed by implantation through the top surface of the silicon wafer.

Applicant refers to the device 10 as a Generation 1 device, since the device 10 had been subsequently improved to be a Generation 2 device, described below.

One issue with the device 10 of FIG. 1 is that a high current (which may be constant or a transient) may cause latch-up, and a relatively large negative gate voltage is needed to turn the device off. Such a large negative voltage may not be convenient to generate. During latch-up, the on-resistance is desirably lower, and the device 10 acts as a thyristor.

Generation 2 cells are shown in the power device 48 of FIG. 2 replacing the Generation 1 cells in FIG. 1, except for the edge cell with the opening 16 in the n+ source 52. In FIG. 2, an n-MOS device (or n-channel MOS device) turns the device 48 on with a positive gate voltage, and a p-MOS device (or p-channel MOS device) rapidly turns the device 48 off with a negative gate voltage. Thus, n-MOS and p-MOS devices are in the same cell. FIG. 2 is also copied from U.S. Pat. No. 9,391,184.

In contrast to the power device 10 of FIG. 1, the cells of FIG. 2 include an n-layer 50 that is more lightly doped than an n+ source region 52. A p+ region 54 is formed on both sides of the n+ source region 52, adjacent to the gate 12, and extends below the n+ source region 52. The p-layer 50 extends below the p+ region 54 to form a channel in a p-channel MOSFET when the p-channel MOSFET is biased on. The n-layer 50 can also be referred to as a body region of a DMOS transistor. The p+ regions 54 and the n+ source regions 52 are shorted together by the cathode electrode 20.

When the gate voltage applied to the gate electrode 25 is above the threshold for turn-on of the device 48, the p-channel MOSFET is off and has no effect on the operation. When the current through the device 48 is sufficiently high, latch-up occurs, initiating thyristor action, and the device 48 cannot be turned off simply by shorting the gate to the cathode electrode 20. By applying a gate voltage sufficiently more negative than the cathode voltage (to exceed the threshold voltage of the p-channel MOSFET), the n-layer 50 adjacent to the gate 12 inverts to create a p-channel between the p+ region 54 and the p-well 14. This conducting p-channel MOSFET turns off the base-emitter diode of the npn transistor, forcing the npn transistor to turn off. Therefore, there is no regenerative action. Shorting is not required, since the base-emitter voltage just has to be low enough to turn off the npn transistor. The doping level of the n-layer 32 determines the threshold voltage of the p-channel MOSFET.

Accordingly, the Generation 2 device 48 may be turned off after being in latch-up with only a small negative gate threshold voltage for the p-channel MOSFET, instead of a large negative gate voltage for the Generation 1 (FIG. 1) device 10. For example, the device 10 of FIG. 1 may need a gate voltage of −12 volts to turn the device 10 off after latch-up, while the device 48 of FIG. 2 may need a gate voltage of only −3 volts, depending on the particular characteristics of the device 48. It may also not be possible to turn off the latched thyristor with any negative voltage in the Generation 1 device. As previously mentioned, latch-up can be beneficial since it lowers the voltage drop across the device 48.

The power devices of FIGS. 1 and 2 are similar to many other types of high current/high voltage insulated gate power devices in that they are cellular and the trenches are typically completely filled with doped polysilicon, with the source regions adjacent to the top portion of the polysilicon in the trenches. The sources are formed by implantation through the top surface of the silicon wafer, before or after the trenches are formed.

Each of FIGS. 3-6 is a cross-section of two insulated trench gates that are typically formed in vertical switches, such as the power devices of FIGS. 1 and 2. In FIG. 3, the etched trenches 60, having a gate oxide layer 62, are over-filled with doped polysilicon 64 to ensure the trenches 60 are completely filled. This results in excess polysilicon 64 over the top surface of the wafer.

In FIG. 4, a blanket etch etches away the polysilicon 64 on the surface of the wafer and partially etches the polysilicon in the trench to ensure there is no polysilicon on the surface of the wafer, as shown in FIG. 5.

FIG. 6 shows how the implanted n+ source regions 66 have at least a portion that is below the polysilicon 64 in the trench. It is important for proper operation of the device that there be no vertical gap between the n+ source regions 66 and the top of the polysilicon 64, since the inversion layer must extend from the bottom of the n+ source regions 66 to the bottom of the gate. Therefore, the n+ source regions 66 must be formed to be relatively deep, or the polysilicon 64 must be etched so as not to go below the silicon surface. It is not usually desirable to have deep n+ source regions, since this may reduce the breakdown voltage, require longer processing times, and/or require higher processing temperatures. If it is discovered after fabrication that the n+ source regions 66 do not extend below the polysilicon 66, the wafer must be scrapped.

Therefore, what is needed is a simple fabrication technique that ensures that at least some portion of the n+ source regions is adjacent to the doped polysilicon in the trenches, even if the polysilicon is etched to be significantly below the top of the trench.

Additionally, what is also needed is a technique to more easily form n-MOS and p-MOS devices, such as in the same cell for the Generation 2 device discussed above.

SUMMARY

The present invention has multiple purposes in insulated trench gate devices. One purpose is to ensure that the n+ source region extends below the top of the polysilicon in the trench, even if the polysilicon is etched down well below the top of the trench.

Another purpose is to form n-MOS devices and p-MOS devices in a reliable manner, such as for the Generation 2 devices.

In a trench-gate device, the polysilicon is etched below the top surface of the trench, leaving a thin gate oxide layer exposed near the top of the trench. An angled implant is conducted that implants ions through the exposed gate oxide and into the side of the trench. If the implanted dopants are n-type and a source formed in the top surface between trenches is n-type, the implanted dopants may be used to extend the n+ source region to be below the top of the polysilicon in the trench.

If the implanted dopants are p-type, the dopants may be used to form a p-MOS device, where a p-source is near the top of the trench, an n-type source is below the p− source adjacent to the polysilicon, and a p-layer is below the n-type source, such that the n-type source forms a p-channel in the p-MOS device when the polysilicon is biased with a negative voltage.

The conductivity types may be reversed. For a Generation 2 device, the n-MOS and p-MOS devices are formed in the same cell.

Forming regions by an angled implant through the gate oxide has some advantages over implanting through the top surface of the silicon wafer. Very narrow-width n+ sources and p+ sources may be formed for increased cell density. Further, the implant depth is very easy to control. Further, the implant is self-aligned due to the polysilicon acting as a mask in the trench. Diffusion causes the implanted atoms to slightly extend below the polysilicon level. Further, n-MOS and p-MOS devices can easily be formed next to each other (or in the same cell) for various applications not limited to the Generation 2 devices. Further, the n+ sources between trenches can be very shallow, and only the edges of these sources (next to the trenches) can be extended below the polysilicon using the angled implant for form n-MOS devices. Shallow sources can increase the breakdown voltage of the device and reduce processing times and temperatures.

In the case of the Generation 1 and Generation 2 devices, the n-type dopant concentration in the top n+ source regions can be high for a high efficiency emitter, and the dopant concentration for the n−source extension adjacent to the trench can be lower, since the n−source extension is only for turning on the device. This approach may improve the breakdown voltage by not requiring a deep n+ source region.

Other Advantages Exist.

In another embodiment, the angled implant can be used to convert some n-MOS cells into an area that weakly connects the p-well to the source cathode to weakly bias the p-well, which increases the tolerance of the device to transients and unwanted turn on.

In another embodiment, a p-type angled implant through the gate oxide may be used to control a threshold voltage of the n-MOS device.

Angling an implant can be implemented by angling the wafer with respect to the source of the energized ions.

Other Embodiments are Disclosed.

BRIEF DESCRIPTION OF THE DRAWINGS

Elements that are the same or equivalent in the various figures may be labeled with the same numeral.

DETAILED DESCRIPTION

Although the techniques of the present invention can be used for various applications, a few examples will be given with reference to Applicant's Generation 1 and Generation 2 devices. The general invention is an angled implant through gate oxide lining a trench, where doped polysilicon (or another conductor) in the trench exposes a portion of the gate oxide on the trench sidewall near the top of the trench. Depending on the conductivity and depth of the angled implant, p-MOS and/or n-MOS devices can be formed, threshold voltages can be adjusted, weak connections to p-wells can be performed, and other structures can be achieved.

Figure 7:
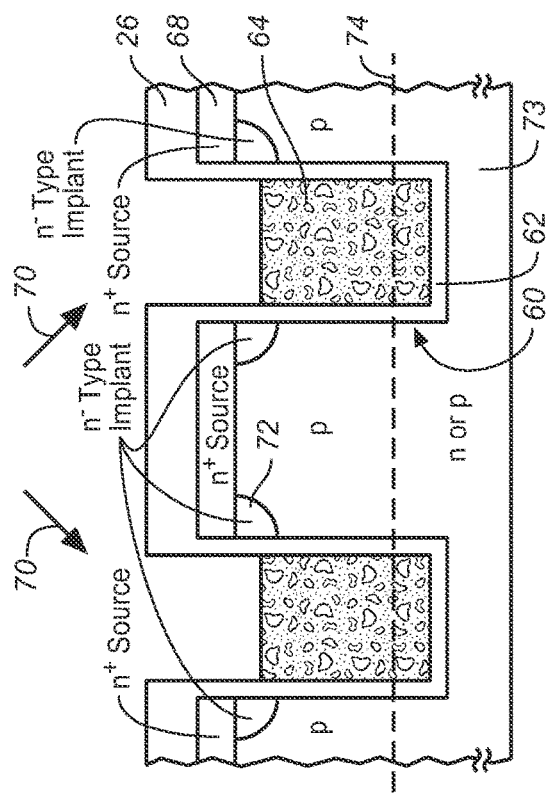
FIG. 7 illustrates the device of FIG. 5 where a relatively shallow n+ source is formed in the silicon so that it does not extend down below the polysilicon in the trench. In this case, no n-MOS is formed and the device does not work.

In FIG. 7, the doped polysilicon 64, or other conductor, such as a metal silicide or a metal, is etched down below the top of the trench 60 to expose a portion of the gate oxide 62 on the sidewall of the trench 60.

Prior to formation of the trenches 60 or after the formation of the trenches 60, n-type dopants are implanted in the top of the silicon wafer to form shallow n+ source regions 68. Since the n+ source regions 68 are too shallow and are not adjacent to the polysilicon, no inversion occurs when the gate is positively biased, and no n-MOS device is formed. Shallow n+ sources have advantages, such as providing a higher breakdown voltage compared to deeper n+ sources.

Figure 8:
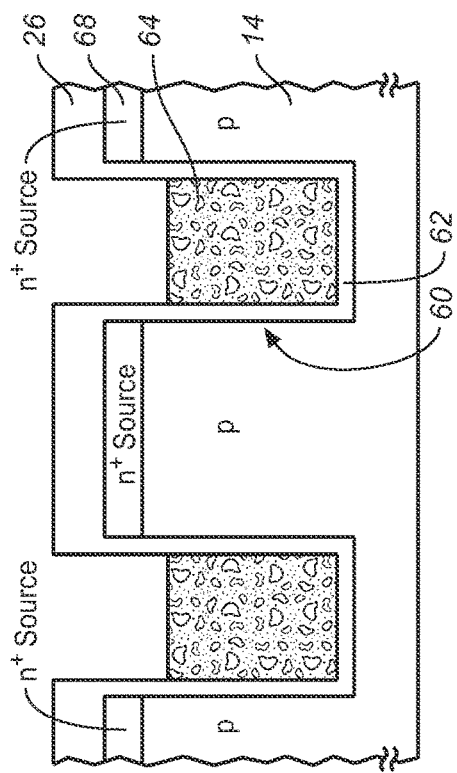
FIG. 8 illustrates the device of FIG. 7 where an angled implant of n-type dopants is performed through the gate oxide to extend the edges of the n+ source region down to the polysilicon in the trench, which then forms an n-MOS device. The implanted dopants are later diffused (e.g., by heat) to go below the top of the polysilicon.

In FIG. 8, an angled implant 70 is performed to inject n-type dopants (e.g., phosphorous) through the thin gate oxide 62 and into the silicon. The polysilicon 64 acts as a mask so the implant is self-aligned. The optimal implant energy and dosage depends on the application, and one skilled in the art would know the optimal implant energy and dosage from simulations or testing. The resulting n-type extension 72 (after diffusion and activation of the implanted atoms) extends below the polysilicon 64 to effectively extend the n+ source regions 68 to be below the top of the polysilicon 64 to form an n-MOS device. Thus, when the gate is sufficiently positively biased, an inversion forms along the trench 60 to turn on the Generation 1 device. The advantages of the shallow n+ source regions 68 remain.

In an alternative embodiment, if the device to be formed is a simple vertical MOSFET, the layer 73 below the dashed line 74 would be n-type so the inversion along the trench 60 forms a vertical n-channel between the n-type extension 72 and the lower n-type layer 73 to conduct current between the two n-type materials.

The angled implant invention applies to many types of trench gate devices, where the devices can be the Generation 1 or 2 devices, or vertical MOSFETs, or IGBTs, or thyristors, or other suitable devices.

Figure 9:
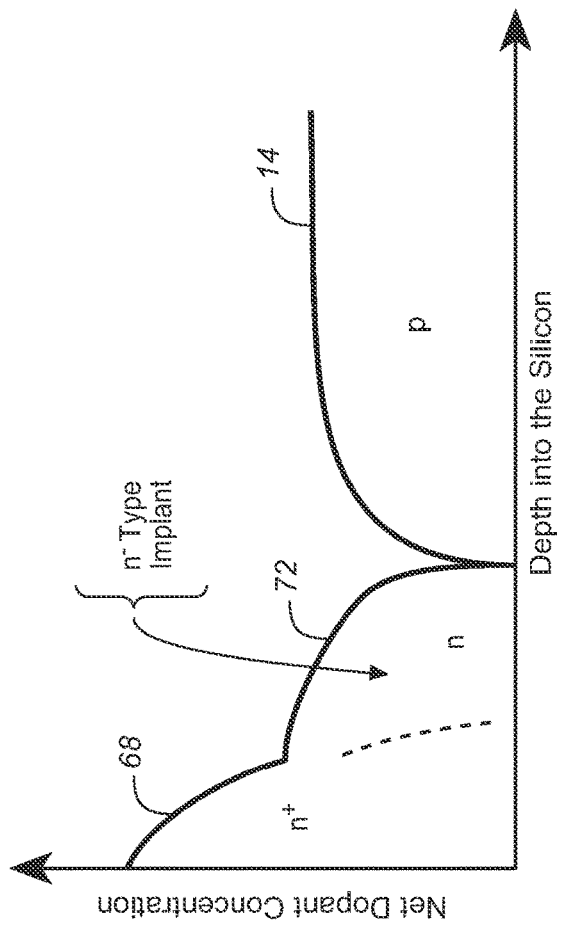
FIG. 9 is a dopant profile of the device of FIG. 8 in the silicon along the outside of the trench, showing the two different n-type dopant concentrations of the top n+ source region and the n-type extension adjacent to the polysilicon in the trench.

FIG. 9 is a doping profile along the trench sidewall of FIG. 8 showing the shallow n+ source region 68, the n-type extension 72, and the p-well 14. Note that the dopant concentration of the n-type extension 72 is less than that of the n+ source region 68, since the n-type extension 72 only has to ensure that the gate forms an inversion along the trench 60 to initiated full turn-on of the Generation 1 or 2 device. If the device is a vertical MOSFET, where an n-layer (e.g., layer 73 in FIG. 8) is formed near the bottom of the trench 60, the n-type extension 72 may have a higher concentration to improve conductivity.

Figure 10:
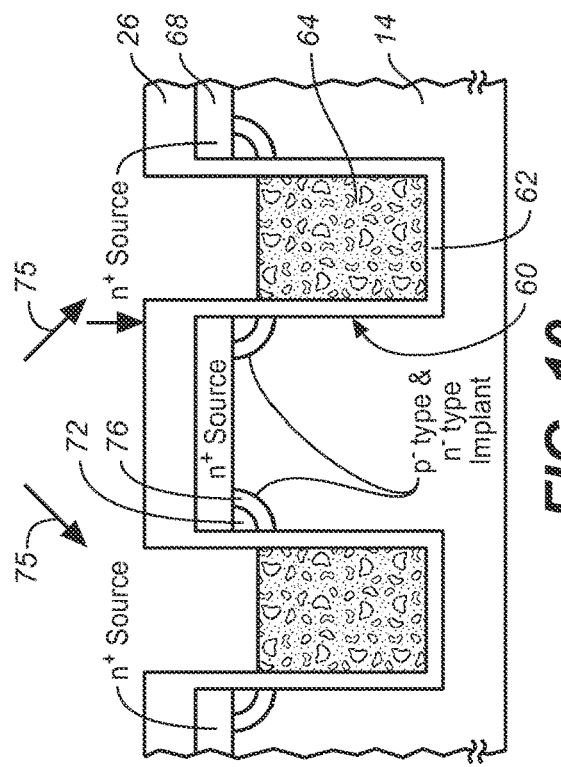
FIG. 10 illustrates the use of a p-type implant through the gate oxide to control the threshold voltage of the n-MOS device.

In FIG. 10, an angled implant 75 of a p-dopant (e.g., boron) is made through the exposed gate oxide 62 to form a p-type region 76 between the p-well 14 and the n-type extension 72 to adjust a threshold voltage of the n-MOS device. A higher dopant concentration in the p-type region 76 raises the threshold voltage. The implant energy of the p-dopants may be higher than the implant energy used to form the n-type extension 72.

Figure 11:
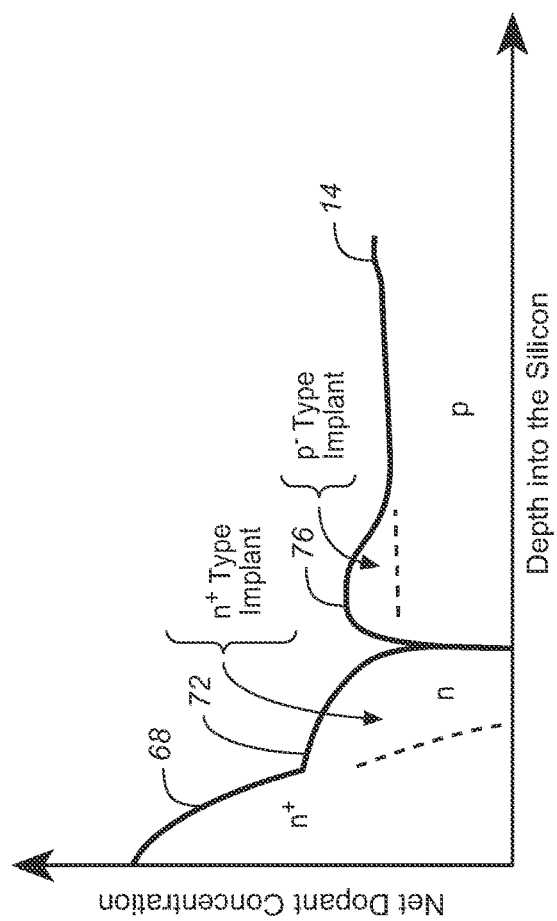
FIG. 11 is a dopant profile of the device of FIG. 10 along the outside of the trench.

FIG. 11 is a doping profile along the trench 60 in FIG. 10, similar to FIG. 9 but showing the additional p-type region 76.

Figure 6:
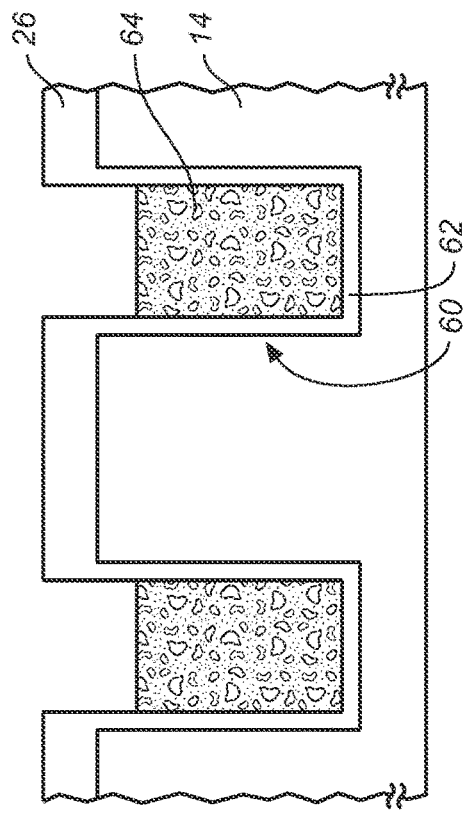
FIG. 6 illustrates the device of FIG. 5 where an n+ source is formed relatively deep into the silicon so that it extends down below the polysilicon in the trench to form an n-MOS device.
Figure 12:
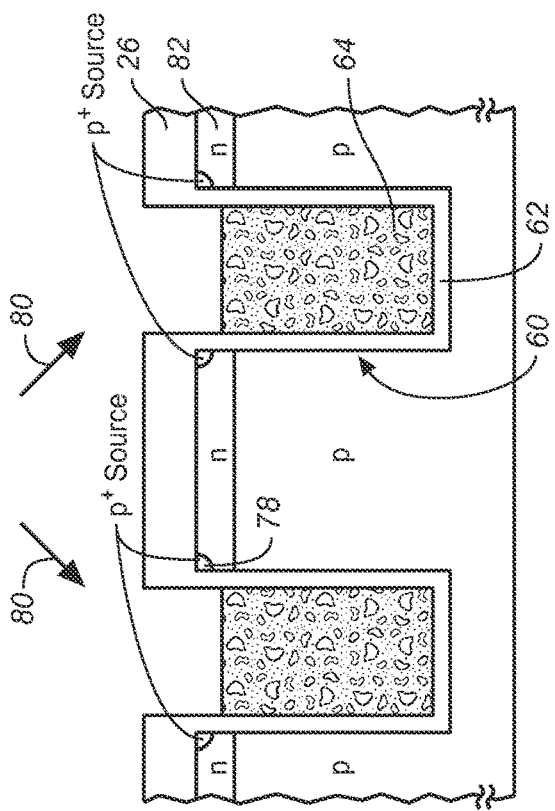
FIG. 12 illustrates how a p-type dopant (e.g., boron) can be angle-implanted through the gate oxide to form a p-MOS device, after the implanted dopants are diffused to extend below the polysilicon. The n-type source region adjacent to the polysilicon forms a channel in the p-MOS device.

FIG. 12 shows the device of FIG. 6 but with a p+ source region 78 formed using the angled implant 80. With the p+ source region 78 extending down to below the polysilicon 64 (after diffusion), a p-MOS device is formed where the n source 82 acts as either an n source for an n-MOS device or an n-channel for a p-MOS device.

Figure 13:
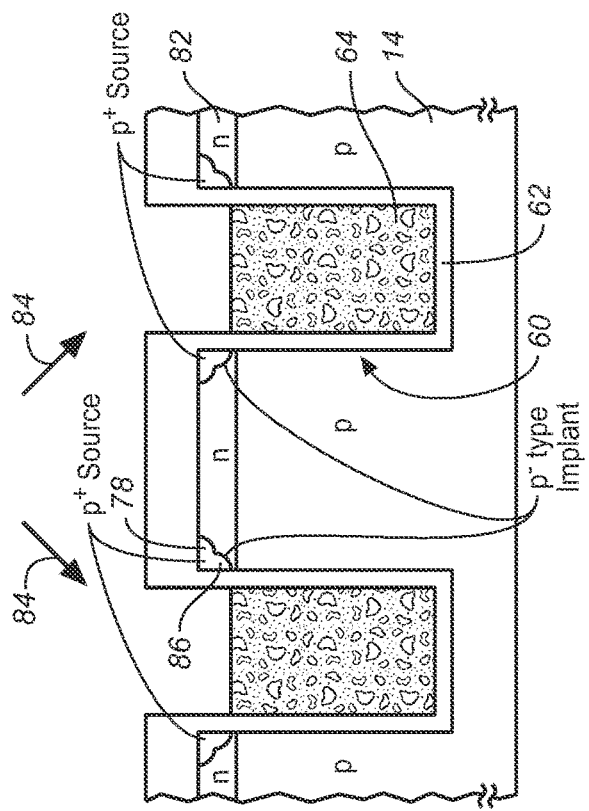
FIG. 13 illustrates the device of FIG. 12 with an extra angled implantation of p-type dopants to either control the threshold voltage of the p-MOS device if the p-type dopant is deep enough, or to cause the p-region to extend completely down to the p-well to create a weak connection between the p-well and the cathode electrode to improving tolerance to transients.

FIG. 13 shows the device of FIG. 12 but with an extra p-type angled implant 84 to form a p-type extension 86 to effectively extend the p+ source region 78 to below the top of the polysilicon 64, with the n source region 82 still abutting the trench 60 below the p-type extension 86. The p-type extension 86 would not be needed if the p+ source region 78 extended below the polysilicon 64. This p-type extension 86 can be used to control a threshold voltage of the p-MOS device. The p-type extension 86 can have a concentration less than that of the p+ source region 78.

Figure 2:
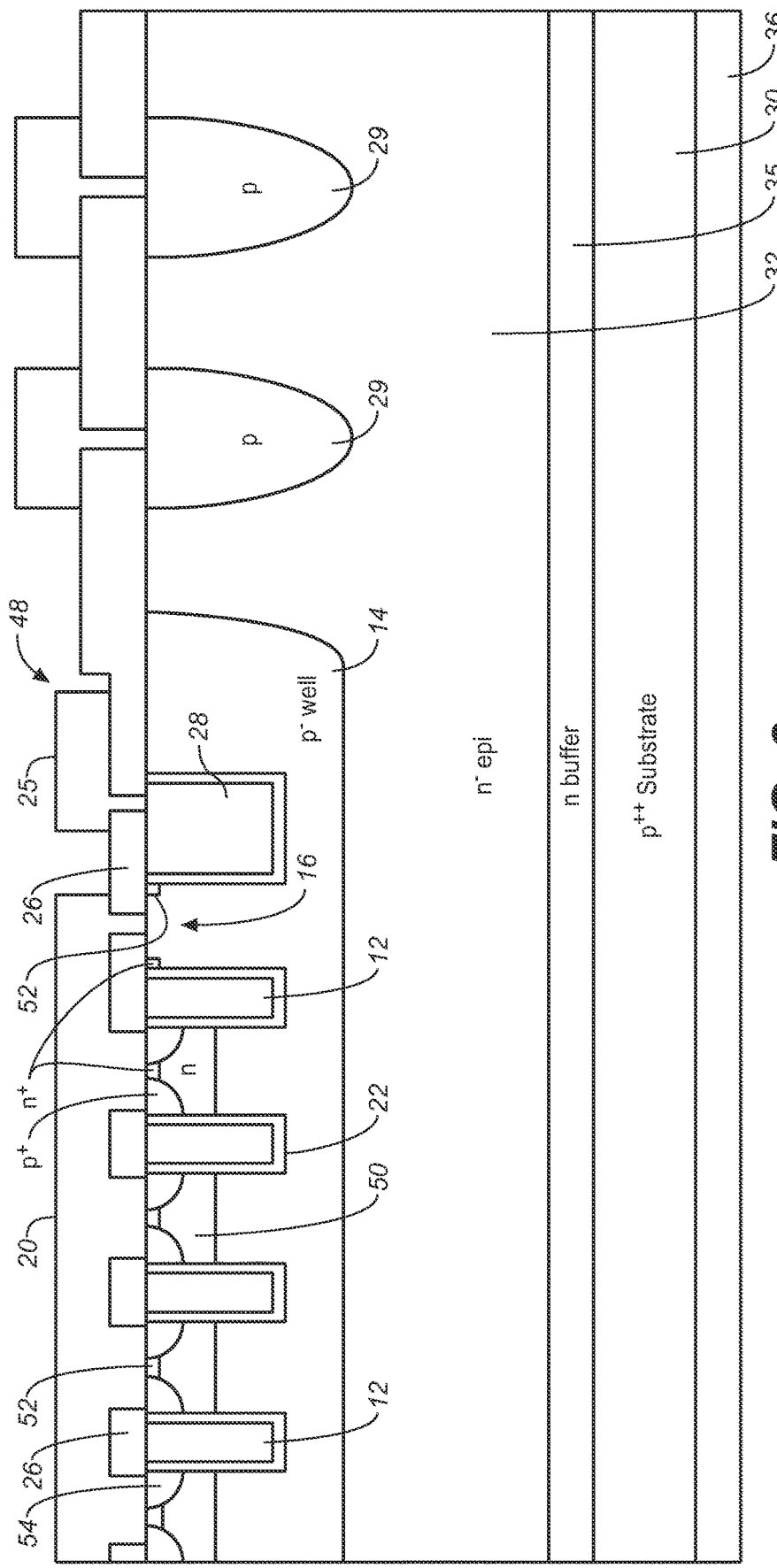
FIG. 2 is also copied from Applicant's U.S. Pat. No. 9,391,184 and includes p-MOS turn off devices in the same cell as the n-MOS turn on devices. This device is referred to by Applicant as a Generation 2 device.
Figure 3:
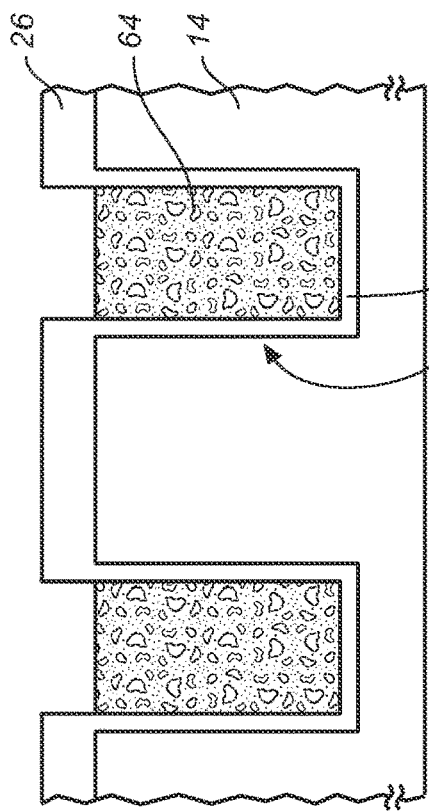
FIG. 3 is a cross-section of a trench in a silicon wafer filled with doped polysilicon, where the polysilicon also covers the top of the silicon wafer.
Figure 4:
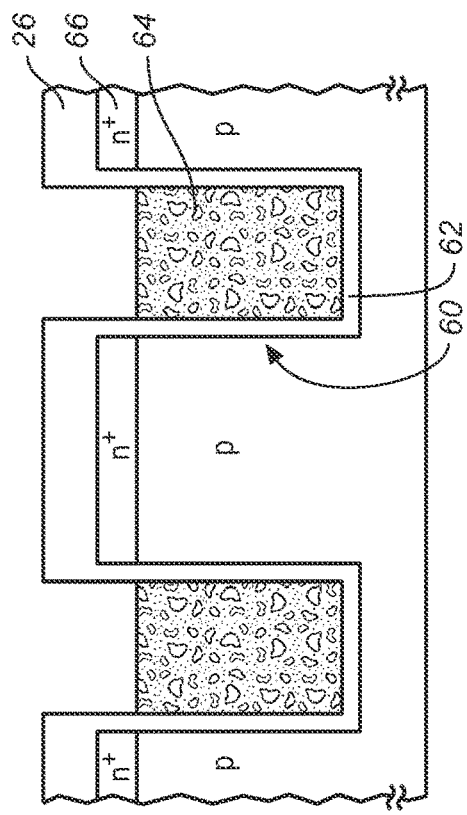
FIG. 4 illustrates an example of the polysilicon being blanket etched to remove the polysilicon from the wafer surface, where the polysilicon fills the trench to the level of the silicon substrate.
Figure 5:
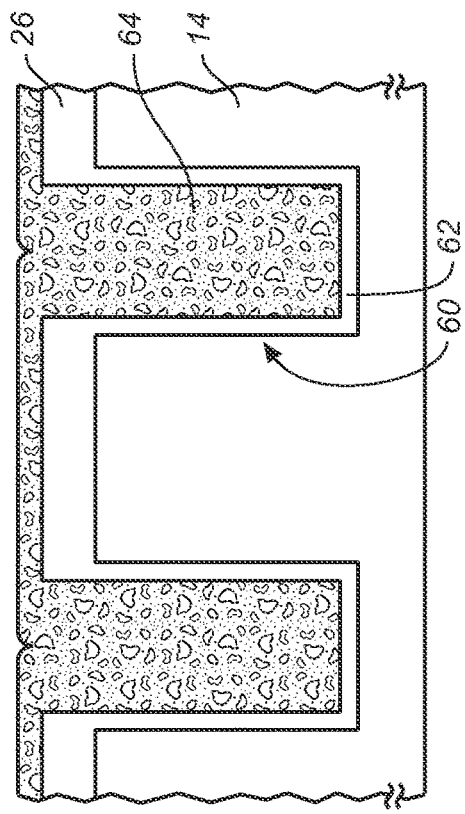
FIG. 5 illustrates an example of the polysilicon being blanket etched to remove the polysilicon from the wafer surface, where the polysilicon is etched well below the top of the trench to ensure no polysilicon remains on the surface of the wafer.

When the gate is sufficiently positive, the p-well 14 surrounding the trench 60 inverts to effectively reduce the base width of the vertical npn transistor (an n-type layer is below the p-well 14) to turn the power device of FIG. 2 on. This constitutes the n-MOS action. To turn off the power device of FIG. 2, the gate is biased sufficiently negative, and the p-MOS device turns on to effectively connect the p-well 14 to the cathode electrode 20 (FIG. 2) to rapidly turn off the vertical npn transistor and remove carriers from the p-well 14 to more rapidly turn off the power device.

Figure 1:
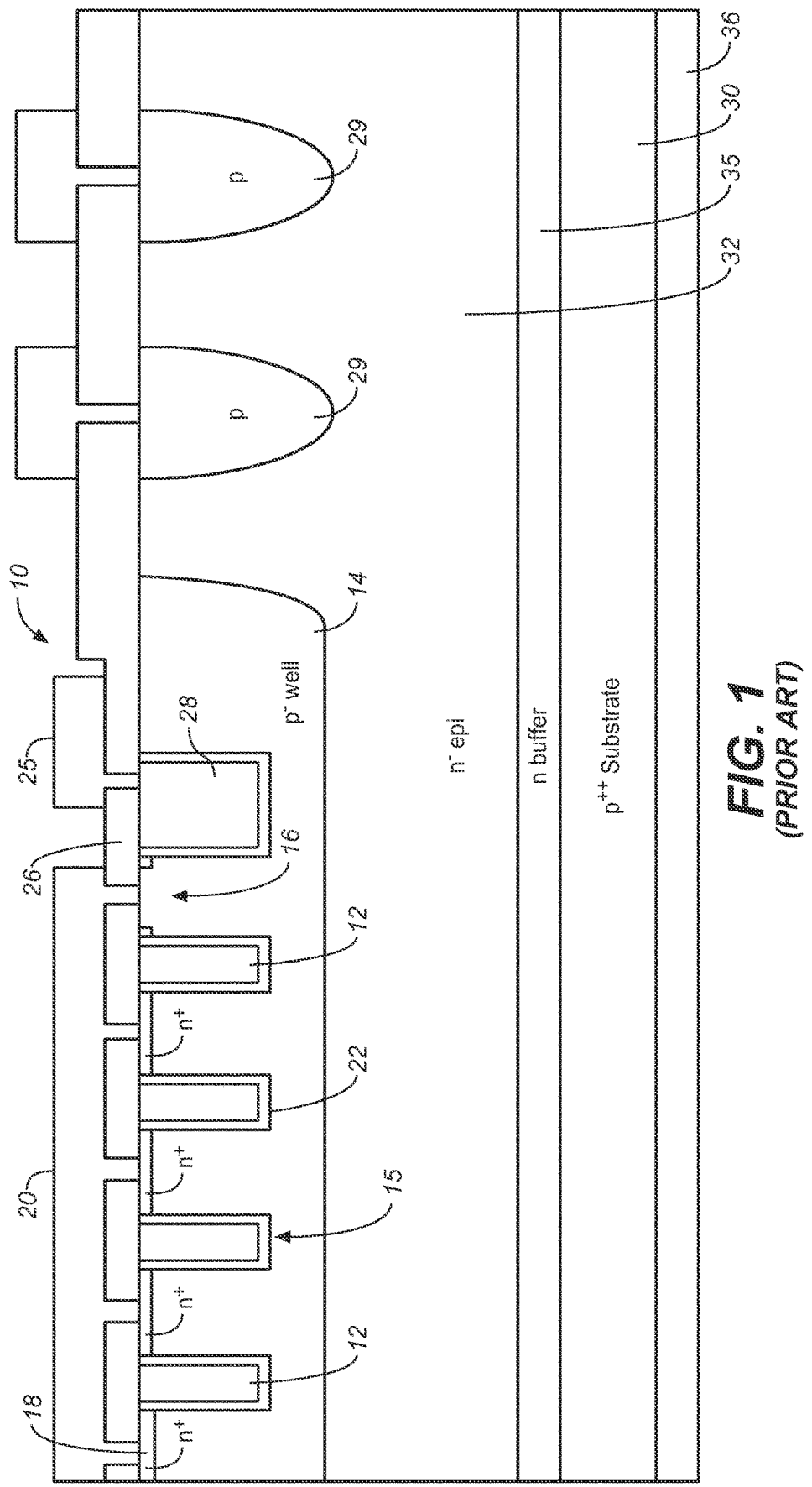
FIG. 1 is copied from Applicant's U.S. Pat. No. 9,391,184 and is a cross-section of a vertical power device having trench gates connected in parallel. This device is referred to by Applicant as a Generation 1 device and uses n-MOS turn on devices in the cells.

If the p-type extension 86 were deeper and reached down into the p-well 14, a weak short would be created between the cathode electrode 20 (FIG. 2) and the p-well 14. This dopant profile improves the tolerance to transients that could undesirably turn on the power device. This structure would replace the opening 16 in FIGS. 1 and 2 for weakly connecting the p-well 14 to the cathode electrode 20 at certain locations on the die.

Figure 14:
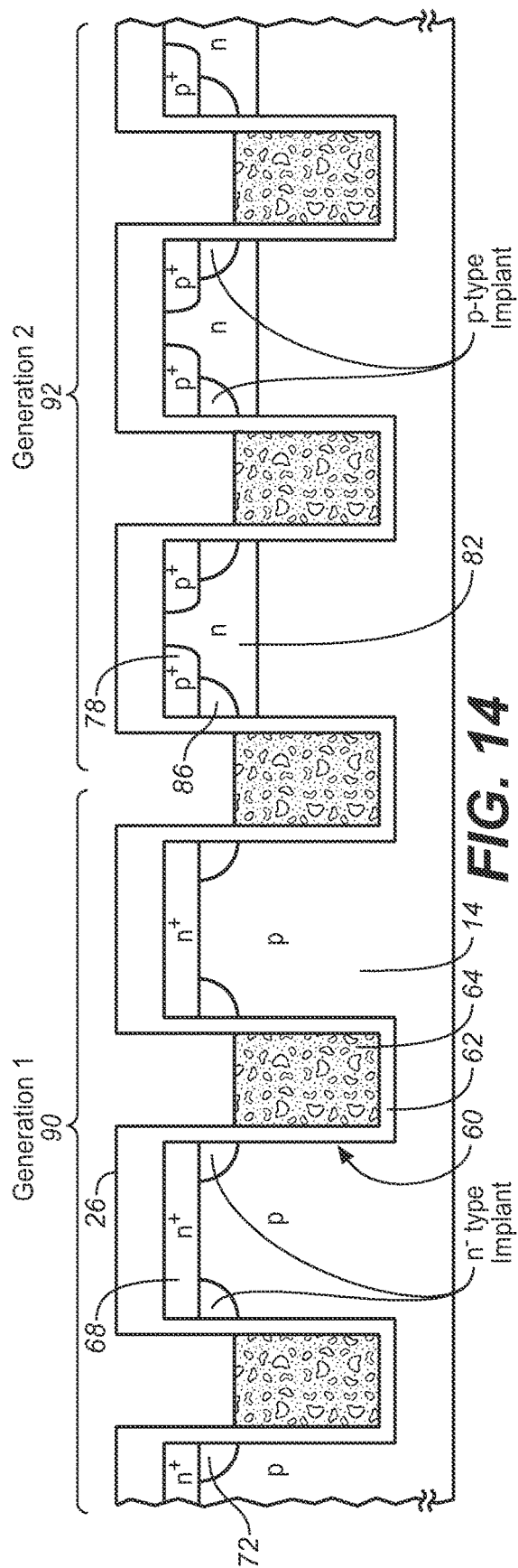
FIG. 14 illustrates how angled n-type implants and angled p-type implants can be performed in different cells to form n-MOS and p-MOS devices for Generation 1 and Generation 2 devices, or for other applications.

FIG. 14 compares cells in the Generation 1 device 90 to the Generation 2 device 92. The Generation 1 n-MOS cells have doped polysilicon 64 that is etched below the top of the trench 60. The shallow n+ source regions 68 do not extend down to the polysilicon 64. An angled implant through the exposed gate oxide 62 forms n-type extensions 72 so that the n-source extends below the polysilicon 64. The extensions 72 can have an n-type dopant concentration that is the same as or less than the n+ source region 68 concentration. The trenches 60 may be on the order of 5-10 microns deep, and the distance from the top of the silicon wafer to the polysilicon 64 may be 1-3 microns. The n+ source regions 68 or the extensions 72 should be at least 1 micron below the polysilicon 64 to ensure good overlap.

If an n-layer existed below the p-well 14 and above the bottom of the trench 60, a vertical MOSFET would be formed, as described with respect to FIG. 8.

The Generation 2 device 92 has the n-type source regions 82 extending below the polysilicon 64 to form n-MOS devices in the cells. The dopant concentration of the n-type source regions 82 tapers down with depth. Additionally, p+ source regions 78 are implanted through the top surface of the silicon wafer, and p-type extensions 86 are angle-implanted through the exposed gate oxide 62 to effectively extend the p-type sources to slightly below the top of the polysilicon 64 and above the bottom of the n-type source regions 82 to form p-MOS devices. A positive gate voltage inverts the p-well 14 surrounding the gate to turn on the n-MOS device, and a negative gate voltage inverts the n-type source region 82 adjacent to the gate. The concentration of n-type dopants adjacent to the gate may be fairly low to easily invert with a small negative gate voltage. Therefore, the turn-on and turn-off gate voltages can be adjusted. An angled n-type dopant implant may also be performed to adjust the turn-off voltage.

Figure 15:
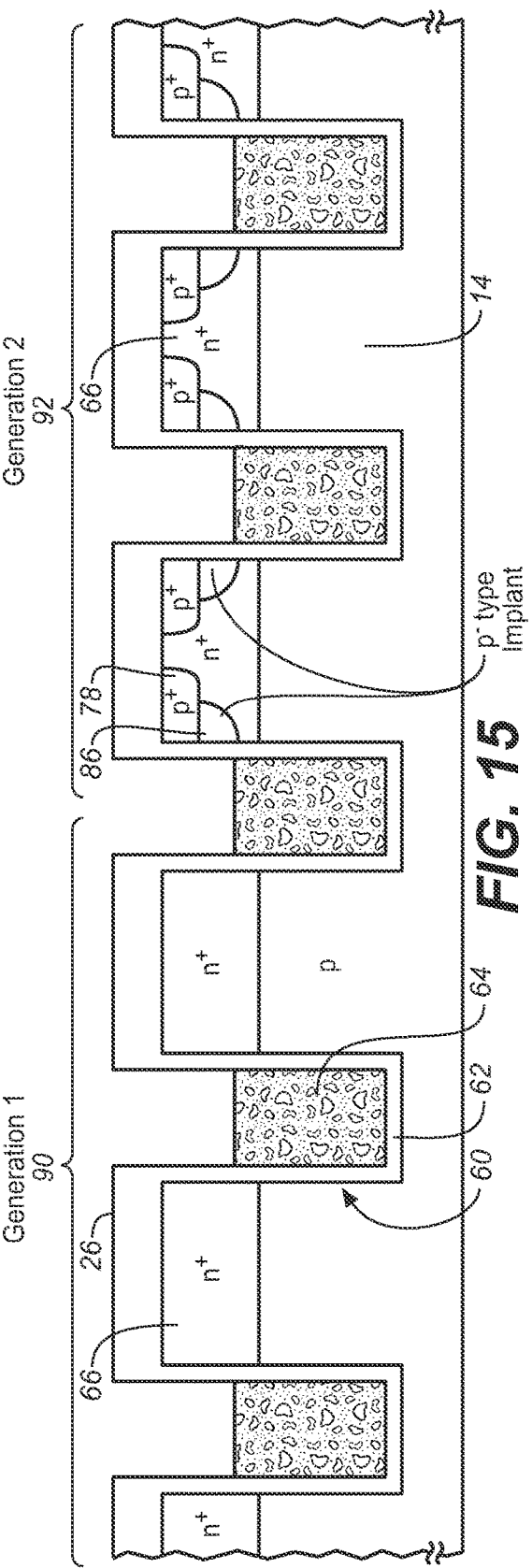
FIG. 15 illustrates the difference between conventional n-MOS devices (on the left side), formed using a deep n+ source, and the combination of n-MOS and p-MOS devices for a Generation 2 device (or other application).

FIG. 15 is similar to FIG. 14 except that the n-type source regions 66 extend below the polysilicon 64, so no n-type extensions are needed.

The various concepts described can be applied to any type of trench-gate device to control various characteristics of the device and to ensure the source regions extend below the polysilicon (or other conductor) in the trenches.

Various features disclosed may be combined to achieve a desired result.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method of forming an insulated trench gate device comprising:
   forming trenches in a semiconductor material of a first conductivity type;
   oxidizing sidewalls of the trenches to form a gate oxide along the sidewalls;
   partially filling the trenches with a conductor such that the gate oxide is exposed on the sidewalls of the trenches above the conductor;
   forming a layer of a second conductivity type above the semiconductor material of the first conductivity type, such that a side of the layer of the second conductivity type abuts the gate oxide along the sidewalls; and
   after the step of forming the layer of the second conductivity type, implanting dopants of at least one of the first conductivity type or the second conductivity type through the exposed gate oxide and at least into the layer of the second conductivity type, wherein the layer of the second conductivity type forms a source region.

2. The method of claim 1 wherein the implanting dopants comprises implanting the dopants at an angle with respect to the sidewalls of the trenches.

3. The method of claim 1 wherein the implanting dopants further comprises implanting the dopants of the first conductivity type into the semiconductor material of the first conductivity type.

4. The method of claim 1 wherein the implanting dopants comprises implanting the dopants of the first conductivity type into the layer of the second conductivity type.

5. The method of claim 1 wherein the implanting dopants comprises implanting n-type dopants to form a vertical n-channel MOS device.

6. The method of claim 1 wherein the implanting dopants comprises implanting p-type dopants to form a vertical p-channel MOS device.

7. The method of claim 1 wherein the trenches are part of cells in the insulated trench gate device, where an individual cell includes both a p-channel MOS device and an n-channel MOS device, wherein the p-channel MOS device turns on with a negative conductor voltage below a negative threshold voltage, and the n-channel MOS device turns on with a positive conductor voltage above a positive threshold voltage.

8. The method of claim 7 wherein the n-channel MOS device, when turned on, turns on the insulated trench gate device, and the p-channel MOS device, when turned on, turns off the insulated trench gate device.

9. The method of claim 1 wherein the insulated trench gate device comprises a vertical MOS switch.

10. A method of forming an insulated trench gate device comprising:
- forming trenches in a semiconductor material of a first conductivity type;
- oxidizing sidewalls of the trenches to form a gate oxide along the sidewalls;
- partially filling the trenches with a conductor such that the gate oxide is exposed on the sidewalls of the trenches above the conductor;
- forming a layer of a second conductivity type above the semiconductor material of the first conductivity type, such that a side of the layer of the second conductivity type abuts the gate oxide along the sidewalls; and
- after the step of forming the layer of the second conductivity type, implanting dopants of at least one of the first conductivity type or the second conductivity type through the exposed gate oxide and at least into the layer of the second conductivity type,
- wherein the layer of the second conductivity type forms a source region, wherein the step of implanting the dopants comprises implanting dopants of the second conductivity type into the source region and below the source region to form a downward extension of the source region.

11. The method of claim 10 wherein a top of the conductor in the trenches is below a bottom of the source region, and the extension extends below the top of the conductor along the trenches.

12. A method of forming an insulated trench gate device comprising:
- forming trenches in a semiconductor material of a first conductivity type;
- oxidizing sidewalls of the trenches to form a gate oxide along the sidewalls;
- partially filling the trenches with a conductor such that the gate oxide is exposed on the sidewalls of the trenches above the conductor;
- forming a layer of a second conductivity type above the semiconductor material of the first conductivity type, such that a side of the layer of the second conductivity type abuts the gate oxide along the sidewalls; and
- after the step of forming the layer of the second conductivity type, implanting dopants of at least one of the first conductivity type or the second conductivity type through the exposed gate oxide and at least into the layer of the second conductivity type,
- wherein the layer of the second conductivity type forms a source region;
- wherein the step of implanting the dopants comprises implanting dopants of the second conductivity type into the source region and below the source region to form a downward extension of the source region; and
- further comprising:
- implanting dopants of the first conductivity type through the exposed gate oxide to form a first conductivity region that extends below the downward extension and below a top of the conductor.

* * * * *